United States Patent [19]

Ten Eyck

[11] Patent Number: 5,101,123
[45] Date of Patent: Mar. 31, 1992

[54] CMOS TO ECL TRANSLATOR CIRCUIT AND METHODOLOGY

[75] Inventor: Timothy A. Ten Eyck, Dallas, Tex.

[73] Assignee: Texas Instruments Incorporated, Dallas, Tex.

[21] Appl. No.: 546,130

[22] Filed: Jun. 29, 1990

[51] Int. Cl.⁵ ............... H03K 19/092; H03K 19/094; H03K 19/02; H03K 19/086
[52] U.S. Cl. ................... 307/475; 307/446; 307/455; 307/482; 307/264
[58] Field of Search ............... 307/475, 443, 454–456, 307/264, 270, 446, 570

[56] References Cited

U.S. PATENT DOCUMENTS

| | | | |
|---|---|---|---|
| 4,656,375 | 4/1987 | Lauffer et al. | 307/475 |
| 4,835,420 | 5/1989 | Rosky | 307/475 |
| 4,849,659 | 7/1989 | West | 307/475 X |
| 4,912,347 | 3/1990 | Morris | 307/475 |
| 4,926,065 | 5/1990 | Coy et al. | 307/475 |
| 4,945,265 | 7/1990 | Estrada | 307/475 X |

OTHER PUBLICATIONS

BiCMOS Technology and Applications edited by A. R. Alvarez, published by Kluwer Academic Publishers, 1989.

Primary Examiner—David C. Nelms
Assistant Examiner—David R. Bertelson
Attorney, Agent, or Firm—B. Peter Barndt; Richard Donaldson; William E. Hiller

[57] ABSTRACT

A translator circuit 82 and operation thereof is disclosed including a control signal generator 48 and an ECL output buffer circuit 84. Control signal generator 48 includes a CMOS inverter comprising transistors 52 and 54. The CMOS inverter is connected to a bipolar junction transistor (BJT) 70 which is further connected to as BJT 76. BJT 70 provides a voltage control signal, $V_{CS}$, to ECL output buffer circuit 84. BJT 76 is connected as a transistor in a differential pair comprising transistors 76 and 86. An ECL output signal, $V_{OUT}$, is generated in accordance with the operational state of transistors 76 and 86 and additional circuitry associated therewith.

26 Claims, 1 Drawing Sheet

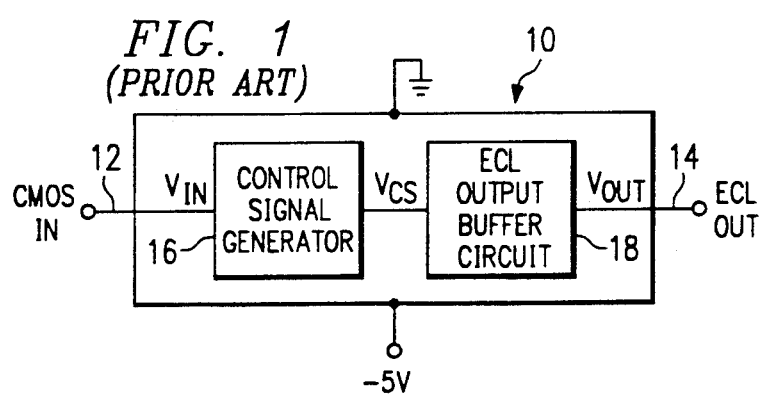
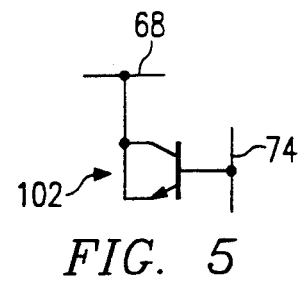
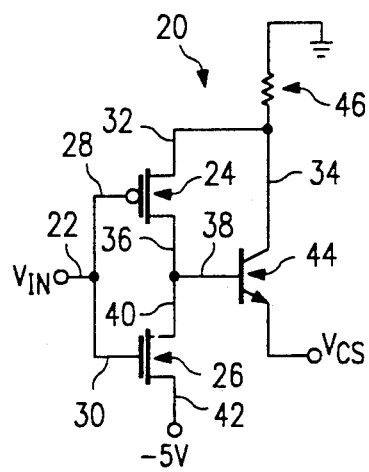
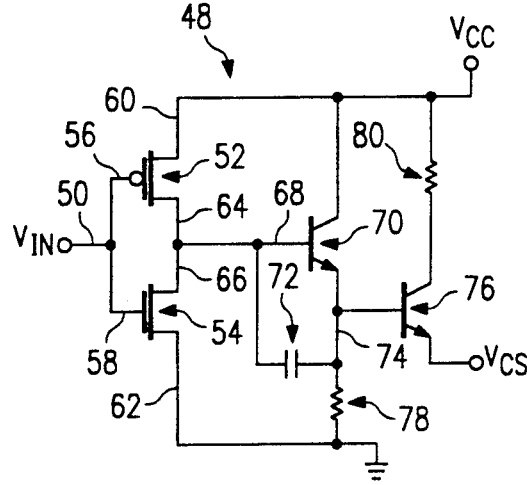
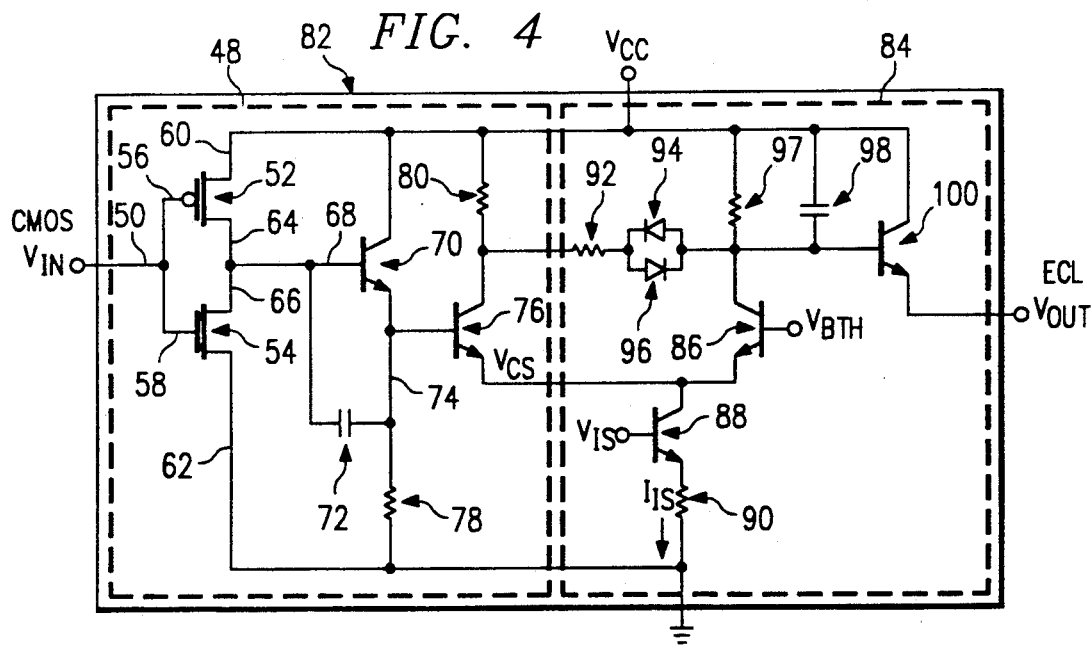

CMOS TO ECL TRANSLATOR CIRCUIT AND METHODOLOGY

TECHNICAL FIELD OF THE INVENTION

This invention relates in general to integrated circuits and more particularly to a circuit and methodology for translating a CMOS signal to an ECL signal.

BACKGROUND OF THE INVENTION

In contemporary digital circuit applications, quite often either CMOS or ECL signals are implemented to effect logic levels both within the chip and off chips. Further, many circuits utilize both ECL and CMOS signals. Accordingly, there exists a need for a circuit and method for translating CMOS signals to suitable ECL counterparts. The CMOS to ECL conversion carries with it a propagation delay for both high to low and low to high signal transitions. Accordingly, it is desirable to provide an efficient CMOS to ECL translator which causes a minimum propagation delay as a result of signal transitions.

A prior art circuit for translating CMOS signals to ECL signals has been heretofore constructed utilizing a CMOS inverter which drives the base of a bipolar junction transistor (BJT). This prior art configuration provides a CMOS to ECL conversion control signal which is converted to an ECL output signal. The propagation delay associated with the high to low transition of the output signal is on the order of 500 to 600 picoseconds. However, the propagation delay during the low to high transition of the ECL output signal is considerably slower for this prior art configuration. Therefore, a need has arisen for a circuit and methodology for providing CMOS to ECL translation such that the propagation delay associated with both low to high transitions and high to low transitions is minimized.

SUMMARY OF THE INVENTION

In accordance with the present invention, a CMOS to ECL translator circuit and methodology are provided which substantially eliminate and prevent disadvantages and problems associated with prior CMOS to ECL translation schemes.

A translator circuit constructed and operated in accordance with the present invention includes an input for receiving an input signal of a first signal type and a first bipolar junction transistor coupled to the input and responsive to the input signal. The bipolar junction transistor is operable to output a control voltage signal such that a second signal type may be generated from the control voltage signal. The inventive circuit further includes a secondary circuit responsive to the control voltage signal to output a second signal type corresponding to the inputted first signal type.

The present invention provides numerous technical advantages over prior CMOS to ECL conversion circuits and methodologies. In particular, the present invention provides the technical advantage of a minimized propagation delay during both high to low and low to high transitions of the output ECL signal. Further, a circuit constructed in accordance with the present invention is buffered from the input signal providing the technical advantage of more consistent AC characteristics. Additionally, the present invention maintains the transistors therein in a non-saturation state thereby providing the advantage of eliminating problems otherwise associated with a transistor operated in a saturation mode.

BRIEF DESCRIPTION OF THE DRAWINGS

For a more complete understanding of the present invention, and the advantages thereof, reference is now made to the following description taken in conjunction with the accompanying drawings in which:

FIG. 1 illustrates a block diagram of a CMOS to ECL signal translator;

FIG. 2 illustrates a schematic of a prior art control signal generator;

FIG. 3 illustrates a schematic of a control signal generator and a partial illustration of an ECL output circuit constructed in accordance with the present invention;

FIG. 4 illustrates a CMOS to ECL translator circuit constructed and operated in accordance with the present invention; and FIG. 5 illustrates an alternative capacitive element for use in the control signal generator of the present invention.

DETAILED DESCRIPTION OF THE INVENTION

FIG. 1 illustrates a block diagram of a prior art CMOS to ECL translator circuit indicated generally at 10. For typical ECL applications, translator circuit 10 is connected between ground and $-5$ volts. Translator circuit 10 includes an input 12 for receiving a CMOS signal and an output 14. Output 14 provides a translated ECL signal corresponding to the CMOS signal received at input 12. Input 12 connects the input voltage signal, $V_{IN}$, to a control signal generator 16. Control signal generator 16 generates a voltage control signal, $V_{CS}$. The voltage control signal $V_{CS}$ is connected to an ECL output buffer circuit 18. ECL output buffer circuit 18 is triggered by $V_{CS}$ to provide an ECL output voltage, $V_{OUT}$, corresponding to the CMOS input voltage received at input 12. Thus, from the above, it may be appreciated that control signal generator 16 and ECL output buffer circuit 18 combine to convert an incoming CMOS signal to an outgoing ECL signal. A high ECL output signal is typically on the order of $-0.95$ volts while a low signal is on the order of $-1.705$ volts.

FIG. 2 illustrates a schematic of a prior art control signal generator denoted generally at 20 and connected to selectively-illustrated componentry within an ECL output buffer circuit 21. Control signal generator 20 may be implemented within control signal generator 16 discussed above in connection with FIG. 1. Control signal generator 20 includes an input 22 which is connected to a CMOS inverter which includes a p channel transistor 24 and an n channel transistor 26. In particular, input 22 is connected to the gate 28 of p channel transistor 24 and the gate 30 of n channel transistor 26. The source 32 of p channel transistor 24 is connected to a first node 34. The drain 36 of p channel transistor 24 is connected to a second node 38. The drain 40 of n channel transistor 26 is also connected to second node 38. Node 38 provides the voltage control signal $V_{CS}$ to ECL output buffer circuit 21. The source 42 of n channel transistor 26 is connected to $-5$ volts.

ECL output buffer circuit 21 includes a pair of differentially coupled bipolar junction transistors (BJTs) 44a and 44b. The collectors of BJTs 44a and 44b L are each connected to a respective resistor 45a and 45b which is further connected to ground. The collector of BJT 44b is also connected to a third node 47 which is connected to output circuitry (not shown) as known in the art. The emitters of BJTs 44a and 44b are connected to a current source 46 which is further connected to −5 volts. The base of BJT 44a is connected to second node 38, and therefore is operable to receive $V_{CS}$. The base of BJT 44b is connected to receive a base threshold voltage, The operation of prior art control signal generator 20 and ECL output buffer circuit 21 is as follows. In general, a CMOS signal is connected to input 22 in order to generate a corresponding control signal, $V_{CS}$. In particular, when a low CMOS signal is received at input 22, p channel transistor 24 conducts while n channel transistor 26 does not conduct. Current is drawn through resistor 45a and p channel transistor 24 to the base of BJT 44a. The flow of current establishes $V_{CS}$ at a voltage dependent on the resistance of resistor 45a. This voltage is compared with $V_{BTH}$, and the respective transistor 44a or 44b having the h base voltage will conduct. In particular $V_{BTH}$, is established lower than $V_{CS}$ when $V_{In}$ is low. Therefore, when $V_{IN}$ is low, $V_{CS}$ is greater than $V_{BTH}$ and transistor 44a conducts while transistor 44b does not. As a result, the current of current source 46 is pulled through resistor 45a rather than resistor 45b. Thus, the voltage drop across resistor 45b is relatively small and third node 47 is at a potential only slightly lower than ground. This potential is then utilized to provide a high ECL output signal.

When a transition occurs from the input signal connected to input 22 going from a logical low to a logical high, p channel transistor 24 is turned off while n channel transistor 26 is turned on. Accordingly, second node 38 is connected through n channel transistor 26 to −5 volts. As a result, $V_{CS}$ is low. BJT 44a turns off and BJT 44b turns on. Consequently, the current $I_{IS}$ from current source 46 is pulled through resistor 45b causing a substantial drop across resistor 45b. Accordingly, the voltage potential at third node 47 is significantly reduced. This reduced potential is then utilized to provide a low ECL output signal. From the above, it may be appreciated that during a low to high transition on input 22 the transition delay associated with prior art control signal generator 20 and ECL output buffer circuit 21 generally may be attributed to the speed of n channel transistor 26 which connects the base of BJT 44a to −5 volts and to the speed of BJT 44a as it turns off.

In comparison, a transition from a high level to a low level on input 22 causes p channel transistor 24 to turn on and n channel transistor 26 to turn off. During this transition, the base of transistor 44a must be pulled upward on the order of approximately 2.9 volts before BJT 44a will begin to conduct. Because p channel transistor 24 is connected through resistor 45a to ground, there is a necessary delay in the time required to pull up this base to an appropriate value. As a result, a significant propagation delay occurs when the input signal connected to input 22 incurs a transition from a high to low signal. The present invention provides for an improved propagation delay for both high to low and low to high transitions of the input of a CMOS to ECL translator circuit.

The preferred embodiments of the present invention are illustrated in FIGS. 3-5 of the drawings, like numerals being used to refer to like and corresponding parts of the various drawings.

FIG. 3 illustrates a schematic of a control signal generator 48 constructed and operated in accordance with the present invention. Control signal generator 48 is connected to, and interacts with, an ECL output buffer circuit 49 which is described generally hereinafter and in greater detail with reference to FIG. 4. Control signal generator 48 includes an input 50. Input 50 is connected to a CMOS inverter which includes a p channel transistor 52 and an n channel transistor 54. It should be noted that the CMOS inverter comprising transistors 52 and 54 operates to isolate the remaining circuitry within control signal generator 48 from any AC component included within the input signal $V_{IN}$. The gate 56 of p channel transistor 52 is connected to the gate 58 of n channel transistor 54, and both gates are connected to input 50. The source 60 of p channel transistor 52 is connected to a first supply voltage level, which in the preferred embodiment is 5 volts, otherwise referred to as $V_{CC}$.

The source 62 of n channel transistor 54 is connected to a second supply voltage level, which in the preferred embodiment is ground. The drain 64 of p channel transistor 52 and the drain 66 of n channel transistor 54 are both connected to a first node 68. First node 68 is further connected to the base of a BJT 70 and a capacitive element 72. Capacitive element 72 and the emitter of transistor 70 are both connected to a second node 74. The collector of transistor 70 is connected to $V_{CC}$. Second node 74 is further connected to the base of a BJT 76 within ECL output buffer circuit 49 in order to provide a control voltage signal $V_{CS}$ to ECL output buffer circuit 49. Additionally, second node 74 is connected to a resistor 78 which is further connected to ground.

The emitter of BJT 76 is connected to a resistor 80 which is further connected to $V_{CC}$. Additional components of ECL output buffer circuit 49 are generally illustrated in FIG. 3; however, the detailed operation and complete component of ECL output buffer circuit 49 will be discussed hereinafter with reference to FIG. 4.

The operation of control signal generator 48 shown in FIG. 3 is as follows, and is best understood with reference to transitions of the input signal connected to input 50. Accordingly, both the situation of a high to low transition and a low to high transition are described below.

When input signal $V_{IN}$, is high, p channel transistor 52 does not conduct and n channel transistor 54 does conduct. In this instance, first node 68 is connected through n channel transistor 54 to ground. As a result, transistor 70 is off because no base current may flow thereto. As a result, the control signal $V_{CS}$ is pulled low through resistor 78. This low state of $V_{CS}$ is translated to a low ECL output signal by turning off BJT 76 as discussed in detail below.

Following the above state, the input signal, $V_{IN}$ may incur a transition from high to low. As a result, p channel transistor 52 will turn on while n channel transistor 54 will turn off. First node 68 is pulled upward through p channel transistor 52 to the first supply voltage level, $V_{CC}$. Once the voltage level at first node 68 exceeds the necessary base to emitter voltage for BJT 70, BJT 70 will begin to conduct thereby permitting current to flow through resistor 78. As a result, a sufficient voltage and current exist at second node 74 in order to substantially increase the magnitude of $V_{CS}$. Accordingly, the control voltage signal $V_{CS}$ will rise to an upper level which is translated to a high ECL output signal by turning on BJT 76 as discussed below in connection with FIG. 4.

From the above description of a high to low transition at input 50, it should be appreciated that this transition causes the base of BJT 70 to quickly be connected to the rail voltage supplied by first supply voltage level $V_{CC}$. This may be compared with the prior art configuration of FIG. 2 wherein the pulling up of the voltage at the base of BJT 44a was accomplished through a resistor 45a causing a associated delay therewith. This delay propagates through the entire prior art circuit causing a delay in the effect of the entire conversion process for the CMOS translation to an ECL signal. In comparison, the present invention provides a circuit and method for quickly powering the base of BJT 70 in response to a high to low transition at the circuit input. Further, because BJT 76 is configured in a fashion to follow transistor 70, the quick conduction of BJT 70 is followed by the quick conduction of BJT 76 as discussed in detail below.

During a low to high transition of $V_{IN}$, n channel transistor 54 turns on while p channel transistor 52 turns off. As a result, first node 68 is connected to ground through n channel transistor 54. In addition to this connection, the preexisting voltage across resistor 78 is coupled through capacitor 72 to first node 68 and to ground through n channel transistor 54. Consequently, the voltage at second node 74 is reduced in an expedited fashion through capacitor 72 rather than allowing the entire voltage to slowly dissipate through resistor 78. This quickened reduction in voltage permits transistor 76 to turn off in an expedited fashion thereby causing the control signal $V_{CS}$ to diminish quickly in response to a low to high transition at input 50. Because the CMOS to ECL translation occurs in response to $V_{CS}$, the increased speed of the transition of $V_{CS}$ will consequently increase the speed (i.e. reduce the propagation delay) of the overall signal translation.

It should be noted that the voltage supply connection of control signal generator 48 between $V_{CC}$ and ground will ultimately result in a pseudo-ECL output signal. Thus, the high logic level will equal approximately $V_{CC}$ −0.95 volts and the low logic level will equal approximately $V_{CC}$ −1.705 volts. It should be understood, however, that the circuit may be connected between ground and −5 volts in order to effect typical ECL output signals.

FIG. 4 illustrates the control signal generator 48 shown in FIG. 3 and implemented within a translator circuit 82 in the general fashion as discussed in connection with FIG. 1 above. Accordingly, translator circuit 82 includes a control signal generator 48 in addition to an ECL output buffer circuit 84. The componentry of control signal generator 48 shown in FIG. 4 is the same as that illustrated in FIG. 3, and therefore the reference numerals used therein are carried forth to FIG. 4. Accordingly, control signal generator 48 shown in FIG. 4 includes an input 50 for receiving a CMOS signal and a BJT 70 and second node 74 for providing a voltage control signal, $V_{CS}$.

With reference to ECL output buffer circuit 84, the emitter of transistor 76 is connected to the emitter of a BJT 86 and to the collector of a BJT 88. The base of BJT 88 receives a current source voltage, $V_{IS}$. The emitter of BJT 88 provides a control current, $I_{IS}$ to a resistor 90 which is further connected to ground. Thus, the combination of BJT 88 and resistor 90 are operable to provide a source of current from either the emitter of BJT 76 or BJT 86 to ground.

The base of BJT 86 is operable to receive a base threshold voltage, $V_{BTH}$. A resistor 92 is connected to the collector of BJT 76 and to a pair of oppositely connected diodes 94 and 96. The combination of diodes 94 and 96 along with resistor 92 are provided as a temperature compensation feature to allow for slight changes in current flow in relation to changes in temperature. Diodes 94 and 96 are further connected to the collector of BJT 86. The collector of BJT 86 is further connected to a resistor 97 which is connected to the first supply voltage, $V_{CC}$. A capacitive element 98 is connected from the collector of BJT 86 to $V_{CC}$. Additionally, the collector of BJT 86 is connected to the base of a BJT 100. The collector of BJT 110 is connected to $V_{CC}$ while the emitter provides the translated ECL output signal $V_{OUT}$.

The operation of translator circuit 82 is as follows. As discussed above, a high CMOS input signal causes second node 74 of control signal generator 48 and $V_{CS}$ to be pulled low. BJT 76 and BJT 86 operate as a differential pair, and therefore the voltage at second node 74 is effectively compared with the base threshold voltage $V_{BTH}$ of BJT 86. Thus the differential pair of transistors 76 and 86 operate such that only one or the other transistor is on for a given pair of respective base voltages. When the base voltage of BJT 76 is lower than that of the threshold base volta $V_{BTH}$ of BJT 86, BJT 86 is on while BJT 76 is off. Conversely, when the base voltage (i.e. the voltage at second node 74) of BJT 76 is greater than $V_{BTH}$, transistor 76 is on while transistor 86 is off. Thus, for a high CMOS input signal, the base of transistor 76 is pulled to ground, transistor 76 is off and transistor 86 is on. With transistor 86 on, the current source constructed of BJT and resistor 90 causes current to be pulled from $V_{CC}$ through resistor 97. As a result, the ECL output voltage, $V_{OUT}$ will equal:

$$V_{OUT} = V_{CC} - V_R - V_{BE} \qquad \text{EQN. 1}$$

where, $V_{CC}$ is the first supply voltage level,
$V_R$ is the voltage across resistor 97; and
$V_{BE}$ is the voltage across the base to emitter junction of BJ 100; and where V may be approximated as:

$$V_R = R \times I_{IS} \qquad \text{EQN. 2}$$

where,

R is the resistance value of resistor 97; and
$I_{IS}$ is the current flowing through the current source comprising transistor 88 and resistor 90.

Thus, from equations 1 and 2 above, it may be appreciated that when transistor 86 conducts, the output voltage, $V_{OUT}$ is significantly reduced as a function of the magnitude of the current source current $I_{IS}$. As will be explained in greater detail below, the additional contribution of current source $I_{IS}$ and the resulting voltage drop across resistor 97 causes the high CMOS input signal to be translated to a low ECL output signal.

A high ECL output signal, $V_{OUT}$ occurs when the CMOS input signal $V_{IN}$ is low. As discussed above, a low CMOS input signal causes the control voltage signal, $V_{CS}$ to be high. Accordingly, BJT 76 is on while BJT 86 is off. In this instance, the ECL output voltage $V_{OUT}$ will still be governed by Equation 1, above; however, because BJT 86 is off, the control current, $I_{IS}$ will no longer be pulled through resistor 97. As a result, the voltage drop across resistor 97 will be significantly decreased, and will equal:

$$V_R = I_B \cdot R \qquad \text{EQN. 3}$$

where $I_B$ is the base current of BJT 100; and

R is the resistance of resistor 97. From equation 3, it may be appreciated that the drop across resistor 97 will be attributable to the base current $I_B$ rather than the control current $I_{IS}$ discussed above in connection with equation 2. Thus, a considerably lesser voltage is lost across resistor 97, and the ECL output signal, $V_{OUT}$, will be significantly higher than in the instance discussed above. Accordingly, a low CMOS input signal, $V_{IN}$ is translated by translator circuit 82 to a high ECL output signal, $V_{OUT}$.

The reduced propagation delays discussed in connection with control signal generator 48 in FIG. 3 have the same benefits when implemented in the circuit of FIG. 4. Accordingly, translator circuit 82 shown in FIG. 4 includes the advantages of having a minimized propagation delay from both high to low and low to high input signal transitions. For example, experimental simulations of the preferred embodiment of the present invention have demonstrated a low to high output transition of 525 picoseconds and a high to low output transition of 470 picoseconds.

FIG. 5 illustrates a schematic of a BJT 102 which may be substituted for capacitive elements 72 and 98 shown in FIG. 4. For example, in substitution of capacitive element 72, the base of BJT 102 is connected to second node 74 while the collector thereof is connected to first node 68. Further, the collector and emitter of BJT 102 are connected to one another. In the preferred embodiment, translator circuit 82 of FIG. 4 is constructed according to well known BiCMOS processes. In accordance therewith, BJT 102 of FIG. 5 permits a bipolar construction of a capacitive element to be utilized for both capacitive elements 72 and 98 shown within FIG. 4. While a bipolar capacitive element is illustrated in FIG. 5, it should further be understood that as an alternative thereto, the gate oxide of a MOS transistor could further be used as a capacitive element to effect capacitive elements 72 and 98.

In accordance with the above, an improved CMOS to ECL translator and operation thereof have been described. The present invention provides reduced propagation delays for input signal translations. Further, a construction for BiCMOS processes is described which may be operated to yield either ECL or pseudo-ECL output signals. The inventive circuit of the present invention may additionally be AC isolated to prevent undesirable effects associated with an AC component of the input signal.

Although the present invention has been described in detail, it should be understood that various changes, substitutions and alterations may be made hereto without departing from the spirit and scope of the invention as defined by the appended claims.

What is claimed is:

1. A translator circuit, comprising:
   an input for receiving an input signal of a first signal type;
   a bipolar junction transistor having a collector connected to receive a first voltage level, a base responsive to the input signal, and an emitter said bipolar junction transistor operable to output a control voltage signal such that a second signal type is generated from the control voltage signal;
   a resistor connected between the emitter and a second voltage level;
   a capacitive element connected between the base and the emitter; and
   a secondary circuit responsive to the control voltage signal to output said second signal type.

2. The translator circuit of claim 1 wherein said first voltage level comprises five volts and wherein said second voltage level comprises ground.

3. The translator circuit of claim 1 wherein said bipolar junction transistor comprises a first bipolar junction transistor, and wherein said capacitive element comprises a second bipolar junction transistor comprising a base, a collector and an emitter, wherein said collector and emitter of said second bipolar junction transistor are connected to said base of said first bipolar junction transistor and wherein said base of said second bipolar junction transistor is connected to said emitter of said first bipolar junction transistor.

4. The translator circuit of claim 1 and further comprising an inverter circuit connected between said input and said bipolar junction transistor.

5. The translator circuit of claim 1 and further comprising an inverter circuit connected between said input and said bipolar junction transistor, wherein said inverter circuit comprises:
   a p channel transistor having a source connected to a first voltage level, and a gate connected to said input such that said p channel transistor may conduct current from the first voltage level in response to the input signal; and
   an n channel transistor having a source connected to a second voltage level, a gate connected to said input, and a drain connected to a drain of said p channel transistor.

6. The translator circuit of claim 1 wherein said secondary circuit comprises:
   an input for receiving the control voltage signal;
   a second bipolar junction transistor coupled to said input;
   a third bipolar junction transistor coupled to said second bipolar junction transistor in a differential configuration;
   a current source connected to said second and third transistors; and
   an output transistor responsive to said control voltage signal for outputting the second signal type.

7. The translator circuit of claim 1 wherein said first signal type comprises a CMOS signal and wherein said second signal type comprises an ECL signal.

8. The translator circuit of claim 1 wherein said first signal type comprises a CMOS signal and wherein said second signal type comprises a pseudo-ECL signal.

9. A translator circuit, comprising:
   an input for receiving an input signal of a first signal type;
   a bipolar junction transistor coupled to said input and responsive to said input signal, said bipolar junction transistor operable to output a control voltage signal such that a second signal type is generated from the control voltage signal, wherein said bipolar junction transistor comprises:

a collector connected to receive a first voltage level;

a base responsive to the input signal; and an emitter for providing the control voltage signal;

a capacitive element connected between said base and said emitter; and a secondary circuit responsive to the control voltage signal to output said second signal type.

10. The translator circuit of claim 9 and further comprising a resistor connected between said emitter and a second voltage level.

11. The translator circuit of claim 10 wherein said first voltage level comprises five volts and wherein said second voltage level comprises ground.

12. The translator circuit of claim 9 wherein said bipolar junction transistor comprises a first bipolar junction transistor, and wherein said capacitive element comprises a second bipolar junction transistor comprising a base, a collector and an emitter, wherein said collector and emitter of said second bipolar junction transistor are connected to said base of said first bipolar junction transistor and wherein said base of said second bipolar junction transistor is connected to said emitter of said first bipolar junction transistor.

13. The translator circuit of claim 9 and further comprising an inverter circuit connected between said input and said bipolar junction transistor, wherein said inverter circuit comprises:

a p channel transistor having a source connected to a first voltage level, and a gate connected to said input such that said p channel transistor may conduct current from the first voltage level in response to the input signal; and an n channel transistor having a source connected to a second voltage level, a gate connected to said input, and a drain connected to a drain of said p channel transistor.

14. The translator circuit of claim 9 wherein said secondary circuit comprises:

an input for receiving the control voltage signal;

a second bipolar junction transistor coupled to said input;

a third bipolar junction transistor coupled to said second bipolar junction transistor in a differential configuration;

a current source connected to said second and third transistors; and an output transistor responsive to said control voltage signal for outputting the second signal type.

15. A method of translating a first signal type to a second signal type, comprising:

receiving the first signal type of an input;

operating a bipolar junction transistor, the transistor having a base responsive to the input signal, receiving a first voltage level at a collector of the transistor, a control voltage signal being provided from an emitter of the transistor, the bipolar junction transistor operable to output the control voltage signal such that a second signal type may be generated from the control voltage signal;

coupling charge at the emitter to a node comprising the base of the bipolar junction transistor; and operating a secondary circuit responsive to the control voltage signal to output the second signal type.

16. The method of claim 15 wherein the bipolar junction transistor comprises a first bipolar junction transistor. and wherein said step of coupling comprises coupling through a second bipolar junction transistor comprising a base, a collector and an emitter, wherein the collector and emitter of the second bipolar junction transistor are connected to the base of the first bipolar junction transistor and wherein the base of the second bipolar junction transistor is connected to the emitter of the first bipolar junction transistor.

17. The method of claim 16 and further comprising buffering the signal received at the input.

18. The method of claim 16 and further comprising buffering the signal received at the input, wherein said step of buffering the signal comprises connecting the input to an inverter circuit connected between the input and the bipolar junction transistor.

19. The method of claim 16 and further comprising buffering the signal received at the input, wherein said step of buffering the signal comprises connecting the input to an inverter circuit connected between the input and the bipolar junction transistor, wherein said step of buffering the signal comprises connecting the input to an inverter circuit connected between the input and the bipolar junction transistor, wherein the inverter circuit comprises:

a p channel transistor having a source connected to a first voltage level, and a gate connected to the input such that the p channel transistor may conduct current from the first voltage level in response to the input signal; and an n channel transistor having a source connected to a second voltage level, a gate connected to the input, and a drain connected to a drain of the p channel transistor.

20. The method of claim 15 wherein the bipolar junction transistor comprise a first bipolar junction transistor, and wherein said step of operating a secondary circuit comprises:

connecting the control voltage signal to an input for receiving the control voltage signal;

operating a second bipolar junction transistor coupled to the first bipolar junction transistor;

operating a third bipolar junction transistor coupled to the second bipolar junction transistor in a differential configuration;

operating a current source connected to the second and third bipolar junction transistors; and outputting the second signal type.

21. The method of claim 15 wherein said step of receiving the first signal type comprises receiving a CMOS signal type and wherein said step of operating a secondary circuit to output the second signal type comprises outputting an ECL signal type.

22. The method of claim 15 wherein said step of receiving the first signal type comprises receiving a CMOS signal type and wherein said step of operating a secondary circuit to output the second signal type comprises outputting a pseudo ECL signal type.

23. A method of translating a first signal type to a second signal type, circuit, comprising:

receiving the first signal type at an input;

operating a bipolar junction transistor coupled to the input and responsive to the input signal, the bipolar junction transistor operable to output a control voltage signal such that a second signal type may be generated from the control voltage signal, wherein said step of operating the bipolar junction transistor comprises:

receiving a first voltage level at a collector of the bipolar junction transistor; and providing the control voltage signal from an emitter of the bipolar junction transistor;

operating a secondary circuit responsive to the control voltage signal to output the second signal type; and coupling the charge at the emitter to a node comprising the base of the bipolar junction transistor.

24. The method of claim 23 wherein the bipolar junction transistor comprises a first bipolar junction transistor, and wherein said step of coupling comprises coupling through a second bipolar junction transistor comprising a base, a collector and an emitter, wherein the collector and emitter of the second bipolar junction transistor are connected to the base of the first bipolar junction transistor and wherein the base of the second bipolar junction transistor is connected to the emitter of the first bipolar junction transistor.

25. The method of claim 23 and further comprising buffering the signal received at the input, wherein said step of buffering the signal comprises connecting the input to an inverter circuit connected between the input and the bipolar junction transistor, and wherein said step of buffering the signal comprises connecting the input to an inverter circuit connected between the input and the bipolar junction transistor, wherein the inverter circuit comprises:

a p channel transistor having a source connected to a first voltage level, and a gate connected to the input such that the p channel transistor may conduct current from the first voltage level in response to the input signal; and an n channel transistor having a source connected to a second voltage level, a gate connected to the input, and a drain connected to a drain of the p channel transistor.

26. The method of claim 23 wherein the bipolar junction transistor comprises a first bipolar junction transistor, and wherein said step of operating a secondary circuit comprises:

connecting the control voltage signal to an input for receiving the control voltage signal;

operating a second bipolar junction transistor coupled to the first bipolar junction transistor;

operating a third bipolar junction transistor coupled to the second bipolar junction transistor in a differential configuration;

operating a current source connected to the second and third bipolar junction transistors; and outputting the second signal type.

* * * * *